(12) United States Patent
Lettang

(10) Patent No.: US 6,362,974 B1
(45) Date of Patent: Mar. 26, 2002

(54) STACKED PROCESSOR CONSTRUCTION AND A METHOD FOR PRODUCING SAME

(75) Inventor: Frank John Lettang, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/528,587

(22) Filed: Mar. 20, 2000

(51) Int. Cl.[7] .............................................. H01R 12/16
(52) U.S. Cl. ........................ 361/790; 361/803; 361/735; 257/686
(58) Field of Search ................................. 361/790, 661, 361/675, 735, 748, 301.4, 803, 785; 439/74, 75; 257/712, 713, 686; 365/51, 52

(56) References Cited

U.S. PATENT DOCUMENTS

| | | | | |
|---|---|---|---|---|
| 4,647,123 A | * | 3/1987 | Chin et al. ............. | 339/17 LM |
| 5,164,916 A | * | 11/1992 | Wu et al. ............... | 365/52 |
| 5,884,319 A | * | 3/1999 | Hafner et al. .......... | 707/104 |
| 5,967,796 A | * | 10/1999 | Hartfiel et al. ......... | 439/61 |
| 5,986,887 A | * | 11/1999 | Smith et al. ........... | 361/704 |
| 6,049,467 A | * | 4/2000 | Tamarkin et al. ...... | 361/790 |
| 6,109,929 A | * | 8/2000 | Jasper ................... | 439/74 |
| 6,128,201 A | * | 10/2000 | Brown et al. .......... | 361/784 |
| 6,147,871 A | * | 11/2000 | Dewitt et al. .......... | 361/752 |

* cited by examiner

Primary Examiner—Jeffrey Gaffin
Assistant Examiner—Hung Bui

(57) ABSTRACT

The present invention provides an apparatus comprising a stacked processor construction and a method for creating the stacked processor construction. The stacked processor construction comprises two or more printed circuit boards (PCBs), each of which has at least one processor mounted thereon, and each of which has a local PCB bus. Each processor is electrically coupled to its respective local PCB bus. The PCBs are stacked substantially parallel to each other in such a way that the processors are not placed into contact with each other. The local PCB buses are electrically coupled together to enable the processors to communicate with each other. A stacking device is connected to the PCBs. The stacking device separates the PCBs a predetermined distance apart from one another and maintains the PCBs in planes that are substantially parallel to one another. The predetermined distance is at least large enough to prevent the processors from being in contact with each other. A group of conductive elements electrically couples the local buses together to enable the processors to communicate with each other. Preferably, the conductive elements are comprised by a high-speed connector, which functions as the stacking device.

20 Claims, 2 Drawing Sheets

STACKED PROCESSOR CONSTRUCTION AND A METHOD FOR PRODUCING SAME

TECHNICAL FIELD OF THE INVENTION

The present invention relates to a stacked processor construction and a method for producing it. More particularly, the present invention relates to a stacked processor construction and a method for producing the stacked processor construction wherein the local PCB bus is optimized to maximize the speed of the local PCB bus.

BACKGROUND OF THE INVENTION

In printed circuit board (PCB) technology, local bus timing challenges have generally been confronted in relation to two-dimensional topologies. The challenges associated with bus length issues have typically been addressed by employing flat, two-dimensional multi-chip modules or by utilizing complex signaling conventions to overcome the speed limitations associated with signal propagation constraints. Generally, in a system where processors are relatively far apart, the system is generally slower due to the length of time required for the signal to travel between the processors via the trace connecting the pins of the processors.

One known solution to this problem is to move the processors closer together on the printed circuit board, thereby shortening the length of the local bus traces interconnecting the processors. Increasing the speed of the local bus enables execution speed to be increased, which increases the speed of the overall system. In order to increase execution speed, many factors must be addressed, including, for example, the timing of the signals sent between the processors and memory. The speed of the local PCB bus is related to the amount of time that is required for a processor to obtain a predetermined amount of data (i.e., a transaction) from memory and load it into the processor. This speed, in turn, relates to the speed of the bus clock and to the data transfer protocol being used. All of these factors are limited by the speed of the local PCB bus, which greatly depends on the trace lengths of the local PCB bus. Therefore, one of the primary factors effecting the overall system speed is the trace lengths of the local PCB bus.

Although moving the processors closer together on the local PCB bus enables the trace lengths of the local PCB bus to be shortened, which can improve the speed of the local PCB bus, two-dimensional topologies are limited with respect to how close to each other the processors can be placed on the PCB. Therefore, a need exists for a method for spatially locating processors in a multi-processor environment with respect to one another such that the trace lengths of the local PCB bus can be minimized, thereby enabling the speed of the PCB bus to be increased.

FIG. 1 illustrates a known multi-processor arrangement in which the processors are arranged on a PCB board in a two-dimensional topology. The arrangement shown in FIG. 1 comprises four central processing units (CPUs) 10, which are all connected to a local PCB bus 11. A core electronics components (CEC) 12 is connected to the local PCB bus 11 and provides an inner face between the CPUs 10 and memory (not shown). The CEC 12 also provides an input/output (I/O) interface for the CPUs 10 and any components (not shown) communicating with the CPUs 10 over the local PCB bus 11 via the CEC 12. Each of the CPUs 10 has particular pins that are connected to each other via the local PCB bus 11. Each of the pins is connected via IC package traces and other conductive bonding elements to the die of the respective CPU 10. Therefore, each pin of each CPU 10 has a particular IC package trace length associated with it.

In addition, the signal pins of each CPU 10 has a local PCB bus trace length associated with it. The term signal pin, as that term is used herein, is intended to generally denote pins that correspond to data and address signals. Some pins of the CPUs 10 are not connected to the local bus. Some pins that are connected to the local bus are not used for data or addresses. The PCB bus trace lengths associated with the signal pins corresponds to the distance between a signal pin of one CPU 10 along the local bus to a signal pin of another CPU 10. This combined IC package trace length and local PCB bus trace length, which will be referred to hereinafter as the die-to-die trace length, is related to the overall speed of the system. Shortening the die-to-die trace lengths can reduce the PCB bus length and thus improve the overall speed of the system. Therefore, in a two-dimensional topology such as that shown in FIG. 1, attempts have been made to route the PCB bus trace lengths in such a way that the die-to-die trace lengths are minimized for certain signals.

A need exists for a method that can be utilized to further reduce the die-to-die trace lengths between the CPUs in order to improve the speed of the PCB bus and of the overall system. Accordingly, a need exists for a method that enables the processors in a multi-processor environment to be located with respect to one another in such a way that die-to-die trace lengths associated with certain signals can be reduced in order to increase the speed of the local PCB bus and of the overall system.

SUMMARY OF THE INVENTION

The present invention provides an apparatus comprising a stacked processor construction and a method for creating the stacked processor construction. The stacked processor construction comprises two or more printed circuit boards (PCBs), each of which has at least one processor mounted thereon, and each of which has a local PCB bus therein. Each processor is electrically coupled to its respective local PCB bus. The PCBs are stacked substantially parallel to each other in such a way that the processors are not placed into contact with each other. The local PCB buses are electrically coupled together to enable the processors to communicate with each other.

In accordance with a first embodiment, the stacked processor construction apparatus comprises a first printed circuit board having a first local bus, which comprises of conductive traces, a first processor mounted on the first printed circuit board and electrically coupled to the first local bus, a second printed circuit board having a second local bus comprised of conductive traces, a second processor mounted on the second printed circuit board and electrically coupled to the second local bus, and a first stacking device connected to the first and second printed circuit boards. The first stacking device separates the first and second printed circuit boards a predetermined distance apart from one another and maintains the first and second printed circuit boards substantially in first and second planes, which are substantially parallel to one another. The predetermined distance is at least large enough to prevent the first processor from being in contact with the second processor. A group of conductive elements electrically couples the first local bus to the second local bus to enable the first and second processors to communicate with each other.

Preferably, the first stacking device is a high-speed, impedance-controlled connector that comprises the group of conductive elements that electrically couple the first and second local buses together. The stacking device may be, for example, a MICTOR™ connector, developed by AMP, Inc. The first and second processors are oriented on the first and second printed circuit boards, respectively, in such a way that the die-to-die distance is optimized for certain signals being communicated between the first and second processors.

Preferably, the stacked processor architecture of the present invention further comprises third and fourth PCBs. The third PCB has a third local bus comprising conductive traces, a third processor mounted on the third printed circuit board and electrically coupled to the third local bus, a second stacking device connected to the second and third printed circuit boards and to the first stacking device, and a second group of conductive elements that electrically couple the first and second local buses to the third local bus to enable the first, second and third processors to communicate with each other.

The fourth PCB is connected to the second stacking device, which has a fourth local bus comprising conductive traces. A fourth processor is mounted on the fourth printed circuit board and is electrically coupled to the fourth local bus. The second group of conductive elements electrically couple the first, second and third local buses to the fourth local bus to enable the first, second, third and fourth processors to communicate with each other. Preferably, the second stacking device is also a high-speed, impedance-controlled connector, such as, for example, a Harman, John M (John) [johnharman@lucent.com]connector, and the second group of conductive elements are comprised by the connector.

In accordance with another embodiment of the present invention, the apparatus comprises two PCBs, each having a processor mounted on opposite sides thereof. Each processor is electrically coupled to the local bus of the PCB on which it is mounted. The PCBs are stacked on a stacking device such as the aforementioned stacking device and are maintained a predetermined distance apart so that the processors on different PCBs do not come into contact with each other.

Other features and advantages of the present invention will become apparent from the following description drawings and claims.

DETAILED DESCRIPTION OF THE INVENTION

Figure 1:
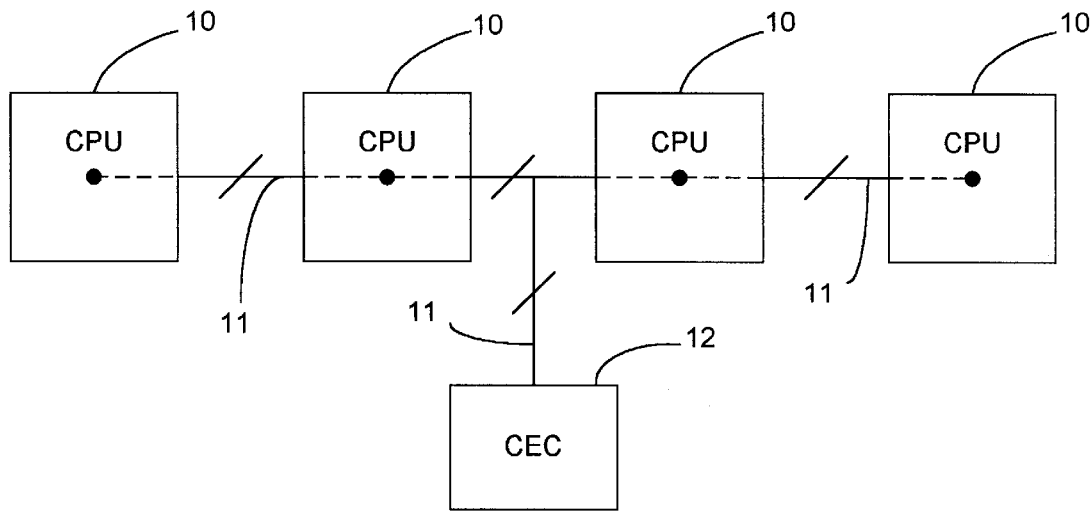
FIG. 1 is a block diagram illustrating a prior art arrangement of a multi-processor printed circuit board that utilizes a typical two-dimensional topology.

It should be noted that the drawings are not necessarily drawn to scale. The drawings are intended to demonstrate the various features, concepts and principles of the present invention, but are not intended to illustrate the actual dimensions of features. The drawings have also been created to comply with the formal drawing requirements, which, in some cases (e.g., font size requirements), prevent features in the drawings from being drawn to scale.

In accordance with the present invention, processors are stacked one on top of another to enable a very fast local bus to be created for coupling the processors together. This approach provides local bus lengths that are substantially shorter than those associated with the aforementioned flat topologies. Furthermore, this approach facilitates different numbers of processor configurations because it enables processors to be easily added. This feature, in turn, enables more competitive products to be produced without having to make many, if any, changes in protocols or very large scale integration (VLSI) techniques. Other features and advantages of the present invention will become apparent from the following description of FIGS. 2–4.

It should also be noted that the local bus trace lengths are not necessarily shortened for all pins of the CPUs. For example, optimizing trace lengths for power pins, ground pins, and control pins may not be an issue. However, for signal pins, optimizing local bus trace lengths is important. Furthermore, signal pins differ in regard to their importance. Therefore, it may be important to optimize trace lengths associated with certain signal pins while not optimizing trace lengths associated with other signal pins. On the other hand, it may be desirable to optimize trace lengths associated with all signal pins, but to differing degrees of optimization. Those skilled in the art will understand the manner in which various factors are taken into account in determining which trace lengths to optimize and the degree to which the trace lengths are to be optimized since this is generally done with the aforementioned 2-D topologies.

Figure 2:
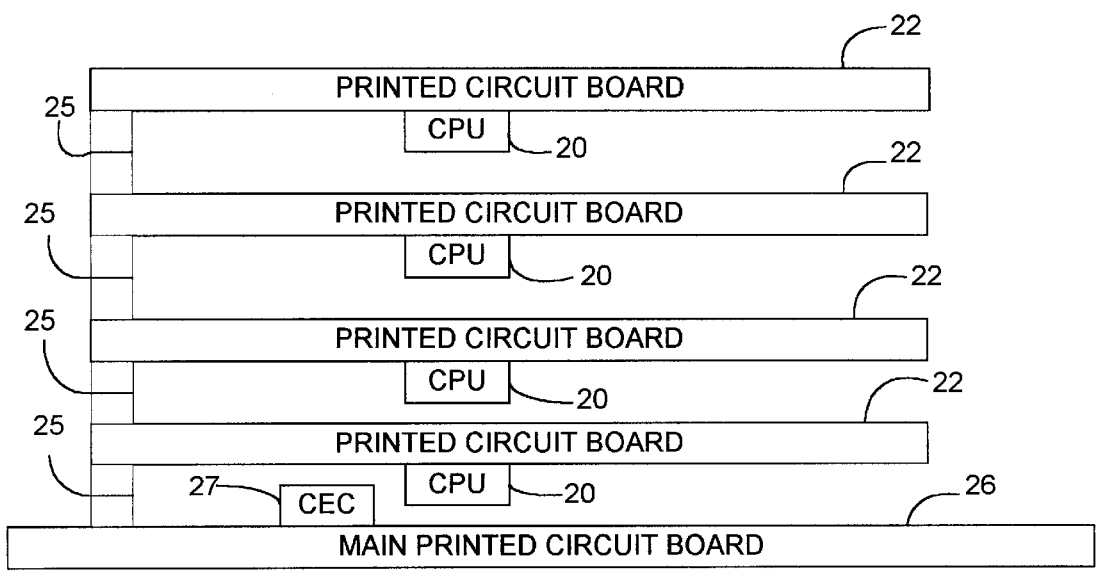
FIG. 2 is a block diagram of a multi-processor configuration wherein the processors are stacked in accordance with a first embodiment of the present invention.

FIG. 2 is a block diagram showing the stacked arrangement of processors in accordance with a first embodiment of the present invention. In accordance with this embodiment, each CPU 20 is mounted on a respective PCB 22. Each of the CPUs 20 has pins (not shown) that are connected via traces (not shown) on the PCBs 22 to a local PCB bus of the PCB 22. These traces can be viewed as being comprised by the local PCB bus. The local PCB bus preferably utilizes a high-speed, impedance-controlled connector 25 for interconnecting each of the PCBs. A main PCB 26 has a core electronics component (CEC) 27 mounted thereon that provides the memory and I/O interface for the CPUs 20.

By utilizing the stacked processor arrangement shown in FIG. 2, the processors can be mounted in closer proximity to one another than in the aforementioned 2-D configuration to enable some or all of the trace lengths of the local PCB bus interconnecting the CPUs 20 to be minimized, thus enabling some or all of the die-to-die trace lengths between the CPUs 20 to be minimized. By minimizing the die-to-die trace lengths in this manner, the timing of the local PCB bus and of the overall system is improved.

Figure 3:
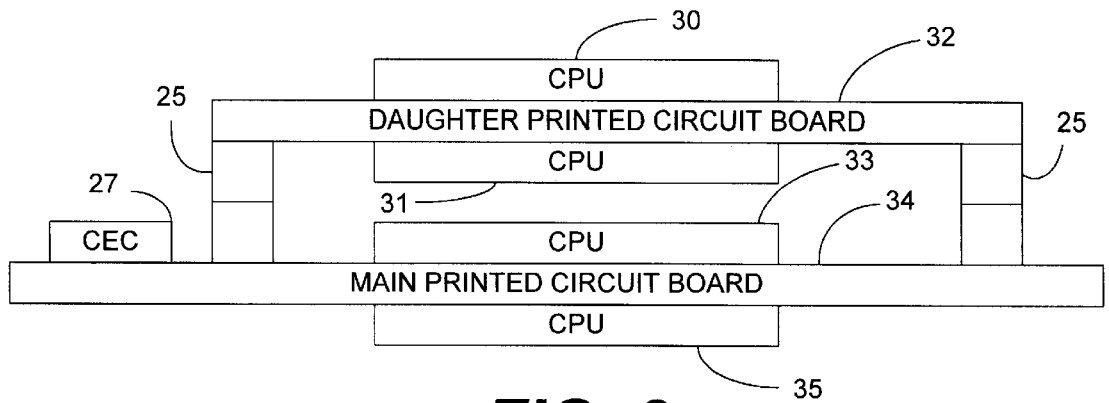
FIG. 3 is a block diagram of a multi-processor configuration wherein the processors are stacked in accordance with a second embodiment of the present invention.

FIG. 3 illustrates an alternative embodiment of the three-dimensional topology of the present invention wherein multiple processors are mounted on the same printed circuit board. As shown in FIG. 3, a first CPU 30 is mounted on one surface of a daughter printed circuit board 32 and a second CPU 31 is mounted on the opposing surface of the daughter printed circuit board 32. Similarly, a CPU 33 is mounted on a first surface of a main printed circuit board 34 and another CPU 35 is mounted on the opposite surface of the main printed circuit board. Each printed circuit board 32 and 34 has a local bus therein to which the processors on the printed circuit boards 32 and 34 are electrically coupled. By mounting the CPUs on opposite sides of the printed circuit boards in this manner, the trace lengths interconnecting CPUs mounted on the same printed circuit boards can be further reduced. Furthermore, by utilizing the stacked arrangement, the trace lengths between the CPUs mounted on the daughter printed circuit board and the CPUs mounted on the main printed circuit board can be also be reduced.

In accordance with this embodiment, preferably the connector 25 that interconnects the daughter and main printed circuit boards 32 and 34 is a high-speed, impedance-controlled stacking connector. A core electronics component (CEC) provides the interface between the CPUs 30, 31, 33 and 35, memory (not shown) and the I/O bus (not shown). Preferably, a MICTOR™ connector is utilized for this purpose. The MICTOR™ connector is manufactured by AMP, Inc. An alternative to the MICTOR™ connector is a type of connector generally referred to as a free-height connector, which is known in the art. Therefore, any suitable connector that is capable of interconnecting the traces of the local bus of one PCB to the local bus of another PCB is suitable for use with the present invention. Preferably, any such connector used for this purpose is a high-speed, impedance-controlled connector.

The MICTOR™ connector is typically utilized for connecting logic analyzers to logic components being tested with the logic analyzer. These types of connectors are also often used to connect a low cost mother board to a parallel, more expensive daughter board having one or more processors on it. This generally enables different processors to be used on the daughter board without having to change the mother board. In this type of construction, the processors are always contained on the daughter board. The daughter board will also typically contain cache memory and other components that need to be close to the processor. The MICTOR™ connector has both female (not shown) and male (not shown) connecting features that provide the conductive paths between the local PCB bus of the main PCB 34 and the local PCB bus of the daughter PCB 32. Those skilled in the art will understand the manner in which such a connector can be used for this purpose.

Although stacking the CPUs in a three-dimensional topology, as shown in FIGS. 2 and 3, enables the die-to-die trace lengths to be shortened considerably, thereby enabling the speed of the overall system to be increased, the CPUs should also be oriented on their respective PCBs in such a way that the IC package trace lengths for some or all of the signals being transmitted between the CPUs are connected to the traces of the local buses in such a way that the die-to-die traces associated with some or all of the signals are optimized. As stated above, it may be desirable to minimize the die-to-die trace lengths for certain signal pins connected to the local buses than for other signal pins connected to the local buses. In order to optimize system performance, it may be desirable to shorten certain local bus trace lengths and minimize others. Those skilled in the art will understand the manner in which determinations can be made as to which trace lengths of the local buses need to be shortened or minimized.

For example, since the die-to-die distance(s) of one or more particular signals may limit the overall speed of the system, shortening or minimizing those die-to-die distances may directly improve overall performance. Therefore, it may be desirable to connect the shortest IC package trace length associated with a particular signal pin to the longest local bus trace length in order to minimize that particular trace length. This may require orienting the IC in a certain manner.

Of course, shortening a particular die-to-die trace length may result in a different die-to-die trace length becoming the longest, which may not improve performance. Therefore, all of the IC package trace lengths should be taken into account along with the trace lengths of the PCB local buses in order to optimize the die-to-die trace lengths. Those skilled in the art will understand the manner in which all of these factors can be taken into account in order to optimize some or all of the die-to-die trace lengths. This can be accomplished by performing a design algorithm Implemented in hardware, in a combination of hardware and software or manually by a designer using the IC package trace lengths and other variables to achieve the optimal design.

Figure 4:
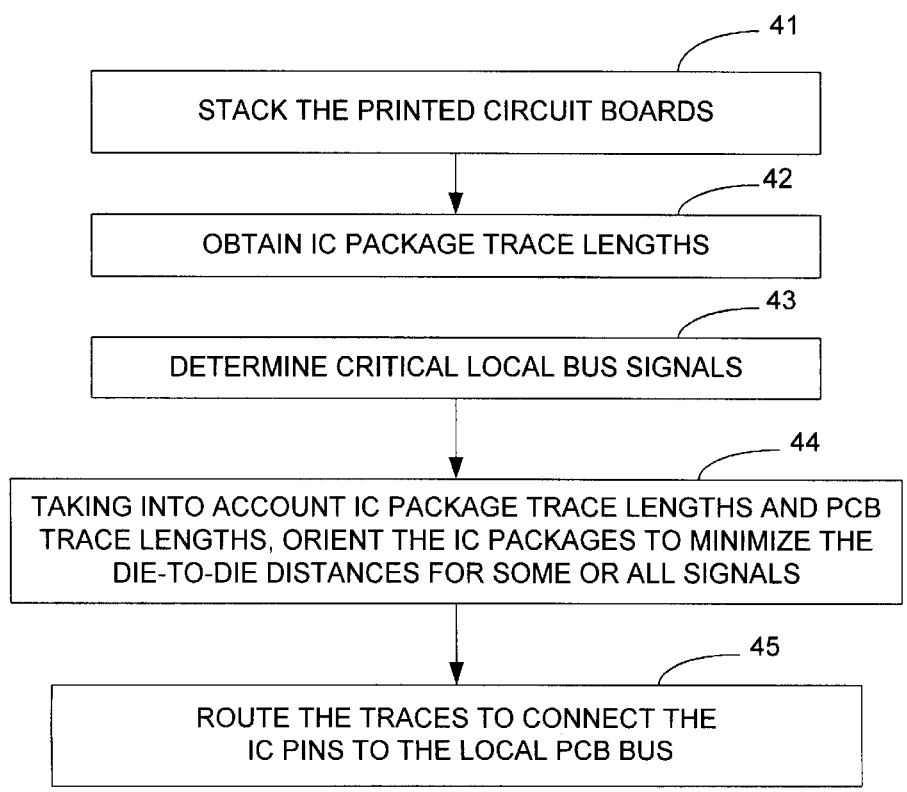
FIG. 4 is a flow chart illustrating the method of the present invention in accordance with the preferred embodiment.

The CPUs should generally be oriented so that the pins that correspond to the shortest on-package traces are connected to the longest trace lengths on the PCB bus for certain signals. This is illustrated by the flow chart shown in FIG. 4. The flow chart shown in FIG. 4 shows the preferred embodiment for performing the method of the present invention. Some or all of the steps shown in FIG. 4 may be performed by a human being. Alternatively, some or all of the steps shown in FIG. 4 may be performed partially by a human being and partially by a computer that calculates the trace lengths and the orientation of the CPUs. Alternatively, the entire method can be automated such that certain steps are performed robotically and other steps are performed in software being executed by a computer and/or by hardware controlling the automated process. Those skilled in the art will understand the manner in which these various embodiments may be implemented.

In accordance with the preferred method of the present invention, the printed circuit boards are stacked in a three-dimensional topology such as that shown in either of FIGS. 2 or 3, as indicated by block 41. The IC package trace lengths are obtained, as indicated by block 42. Of course, the order in which steps 41 and 42 are performed can be reversed from that shown in FIG. 4. The IC packet trace lengths of each of the CPUs are typically known and are typically documented in design specifications associated with the CPUs. The critical local bus signals are determined in order to determine which trace lengths need to be optimized, as indicated by block 43. The IC package trace lengths typically do not need to be determined, but rather, are obtainable from an appropriate source (e.g., the IC designer's design specifications). Once the IC package trace lengths have been obtained, the IC packages are oriented. This step, which is represented by block 44, utilizes the IC package trace lengths and the determination as to the critical trace lengths in order to optimize some or all of the die-to-die trace lengths.

Once the IC packages have been oriented on the printed circuit boards in this manner and the critical local bus signals have been determined, the IC packages are secured to the printed circuit boards and the local PCB bus traces are routed. The pins of the ICs are electrically coupled to the local PCB buses, as indicated by block 45. Preferably, the trace lengths are routed in such a manner that the trace lengths between the pins of the CPUs that are to be connected are optimized.

Therefore, by stacking the CPUs in the three-dimensional topology shown in FIGS. 2 or 3 and by orienting the CPUs in such a manner that the die-to-die trace lengths associated with some or all signals are optimized, the local PCB bus speed is increased. This, in turn, enables the overall speed and performance of the system to be improved.

It should be noted that the present invention has been described with respect to certain embodiments, but that the present invention will not be limited to these embodiments.

Those skilled in the art will understand that modifications can be made to the embodiments discussed above that are within the scope of the present invention. For example, although FIGS. 2 and 3 illustrate four CPUs stacked in a three-dimensional topology, those skilled in the art will understand that the present invention is not limited with respect to the number of CPUs that are stacked. Also, those skilled in the art will understand that the manner in which the local PCB buses of the individual PCBs are interconnected is not limited to any particular types of connectors.

Also, the PCBs shown in FIGS. 2 and 3 will typically have other components mounted thereon. However, for ease of illustration, only the CPUs are shown as being mounted on the printed circuit boards in FIGS. 2 and 3. Those skilled in the art will understand that the three-dimensional stacked topology of the present invention is not limited to any particular design. For example, although each of the PCBs shown in FIGS. 2 and 3 has a single CPU mounted on any particular side thereof, those skilled in the art will understand that the present invention also applies to a stacked arrangement of two-dimensional topologies, such as that shown in FIG. 1 to obtain a stacked three-dimensional topology having virtually any configuration. Of course, those skilled in the art will also understand that the number of CPUs that can be stacked and the manner in which two and three-dimensional topologies can be interconnected may be limited by other design constraints.

What is claimed is:

1. A stacked processor construction apparatus, the stacked processor construction apparatus comprising:
    a first printed circuit board having a first local bus, the first local bus being comprised of conductive traces;
    a first processor mounted on the first printed circuit board, the first processor being electrically coupled to the first local bus;
    a second printed circuit board having a second local bus, the second local bus being comprised of conductive bus traces;
    a second processor mounted on the second printed circuit board, the second processor being electrically coupled to the second local bus;
    a first stacking device connected to the first and second printed circuit boards, the first stacking device separating the first and second printed circuit boards a predetermined distance from one another, the first stacking device maintaining the first and second printed circuit boards substantially in first and second planes, the first and second planes being substantially parallel to one another, the predetermined distance being at least great enough to prevent the first processor from being in contact with the second processor; and
    a first group of conductive elements, the conductive elements electrically coupling the first local bus to the second local bus to enable the first and second processors to communicate with each other.

2. The apparatus of claim 1, wherein the first stacking device is a first high-speed, impedance-controlled connector and wherein said first group of conductive elements are comprised by the first high-speed, impedance-controlled connector.

3. The apparatus of claim 2, wherein the first high-speed, impedance-controlled connector is a MICTOR™ connector.

4. The apparatus of claim 1, wherein the first and second processors are oriented on the first and second printed circuit boards, respectively, in such a way that a die-to-die distance is optimized for all signals being communicated between the first and second processors, the die-to-die distance corresponding to the distance between a die of the first processor and a die of the second processor.

5. The apparatus of claim 4, wherein integrated circuit (IC) package trace lengths associated with the first and second processors are taken into account in orienting the processors to minimize the die-to-die distances for some or all signals being communicated between the first and second processors, each die-to-die distance corresponding to the distance from the die of the first processor, along one IC package trace of the first processor, along one trace of the first local bus, along one of the conductive elements of said first group of conductive elements, along one trace of the second local bus and along one IC package trace of the second processor to the die of the second processor.

6. The apparatus of claim 1, further comprising:
    a third printed circuit board, the third printed circuit board having a third local bus comprising conductive traces;
    a third processor mounted on the third printed circuit board, the third processor being electrically coupled to the third local bus;
    a second stacking device connected to the second and third printed circuit boards, the second stacking device separating the second and third printed circuit boards a predetermined distance apart from one another, the second stacking device maintaining the second and third printed circuit boards substantially in second and third planes, respectively, the second and third planes being substantially parallel to each other, the predetermined distance being at least great enough to prevent the second processor from being in contact with the third processor, the second stacking device being connected to the first stacking device; and
    a second group of conductive elements, the second group of conductive elements electrically coupling the first and second local buses to the third local bus to enable the first, second and third processors to communicate with each other.

7. The apparatus of claim 6, further comprising:
    a fourth printed circuit board, the fourth printed circuit board having a fourth local bus comprising conductive traces;
    a fourth processor mounted on the fourth printed circuit board, the fourth processor being electrically coupled to the fourth local bus;
    a third stacking device connected to the third and fourth printed circuit boards, the third stacking device separating the third and fourth printed circuit boards a predetermined distance apart from one another, the third stacking device maintaining the third and fourth printed circuit boards substantially in third and fourth planes, respectively, the third and fourth planes being substantially parallel to one another, the predetermined distance between the third and fourth printed circuit boards being at least great enough to prevent the third processor from being in contact with the fourth processor, the third stacking device being connected to the second stacking device; and
    a third group of conductive elements, the third group of conductive elements electrically coupling the fourth local bus to the first, second and third local buses to enable the first, second, third and fourth processors to communicate with each other.

8. The apparatus of claim 7, wherein the second and third stacking devices are second and third high-speed, impedance-controlled connectors, respectively, and wherein said second and third groups of conductive elements are comprised by the second and third high-speed, impedance-controlled connectors, respectively, and wherein the connections between the first and second stacking devices and between the second and third stacking devices provides the electrical coupling of the first, second, third and fourth local buses.

9. The apparatus of claim 8, wherein the second and third high-speed, impedance-controlled connectors are MICTOR™ connectors.

10. The apparatus of claim 7, wherein the third and fourth processors are oriented on the third and fourth printed circuit boards, respectively, in such a way that a die-to-die distance is optimized for some or all signals being communicated between the third and fourth processors, the die-to-die distance corresponding to the distance between the die of the third processor and the die of the fourth processor along an IC package trace of the third processor, along a trace of the third local bus, along a conductor of said third group of conductors, and along an IC package trace of the fourth processor.

11. The apparatus of claim 10, wherein integrated circuit (IC) package trace lengths associated with the third and fourth processors are taken into account in orienting the third and fourth processors to minimize the die-to-die distances for some or all signals being communicated between the third and fourth processors, each die-to-die distance corresponding to the distance from a die of the third processor, along one IC package trace of the third processor, along a trace of the third local bus, along one of the conductive elements of said third group of conductive elements, along a trace of the fourth local bus and along one IC package trace of the fourth processor to a die of the fourth processor.

12. A stacked processor construction apparatus comprising:
   a first printed circuit board, the first printed circuit board having a first local bus, the first local bus comprising conductive traces, the first printed circuit board comprising first and second sides;
   a first processor mounted on the first surface of the first printed circuit board, the first processor having integrated circuit (IC) package traces that are electrically coupled to the first local bus;
   a second processor mounted on the second surface of the first printed circuit board, the second processor having IC package traces that are electrically coupled to the first local bus;
   a second printed circuit board, the second printed circuit board having a second local bus, the second local bus comprising conductive traces, the second printed circuit board comprising first and second sides;
   a third processor mounted on the first surface of the second printed circuit board, the third processor having IC package traces that are electrically coupled to the second local bus;
   a fourth processor mounted on the second surface of the second printed circuit board, the fourth processor having IC package traces that are electrically coupled to the second local bus;
   a stacking device connected to the first and second printed circuit boards, the as stacking device separating the first and second printed circuit boards a predetermined distance apart from one another, the stacking device maintaining the first and second printed circuit boards substantially in first and second planes, respectively, the first and second planes being substantially parallel to one another, the predetermined distance between the first and second printed circuit boards being at least large enough to prevent the second processor from being in contact with the third processor; and
   a group of conductive elements, the group of conductive elements electrically coupling the first and second local buses together to enable the first, second, third and fourth processors to communicate with each other.

13. The apparatus of claim 12, wherein the stacking device is a high-speed, impedance-controlled connector, and wherein the group of conductive elements are comprised by the high-speed, impedance-controlled connector.

14. The apparatus of claim 13, wherein the high-speed, impedance-controlled connector is a MICTOR™ connector.

15. The apparatus of claim 12, wherein the first, second, third and fourth processors are oriented on the first and second printed circuit boards in such a way that a die-to-die distance is optimized for some or all signals being communicated between the first, second, third and fourth processors, the die-to-die distance corresponding to the distance between the die of any one of the processors and the die of any other one of the processors along a package trace electrically coupled to the die of one of the processors, along a local bus trace, along one of the conductive elements, along a local bus trace of another processor and along an IC package trace of said another processor.

16. A method for stacking processors, the method comprising the steps of:
   mounting a first processor on a first printed circuit board, the first printed circuit board having a first local bus, the first local bus being comprised of conductive traces, the first processor being electrically coupled to the first local bus;
   mounting a second processor on a second printed circuit board, the second printed circuit board having a second local bus, the second local bus being comprised of conductive traces, the second processor being electrically coupled to the second local bus; and
   stacking the first and second printed circuit boards a predetermined distance apart from one another, the first and second printed circuit boards being stacked on a first stacking device, the first stacking device maintaining the first and second printed circuit boards substantially in first and second planes, respectively, the first and second planes being substantially parallel to each other, the predetermined distance being at least large enough to prevent the first processor from being in contact with the second processor.

17. The method of claim 16, further comprising the steps of:
   mounting a third processor on a third printed circuit board, the third printed circuit board having a third local bus, the third local bus being comprised of conductive traces, the third processor being electrically coupled to the third local bus;
   mounting a fourth processor on a fourth printed circuit board, the fourth printed circuit board having a fourth local bus, the fourth local bus being comprised of conductive traces, the fourth processor being electrically coupled to the fourth local bus;
   stacking the third and fourth printed circuit boards a predetermined distance from one another, the third and fourth printed circuit boards being stacked on a second stacking device, the second stacking device maintaining the third and fourth printed circuit boards substantially in third and fourth planes, the third and fourth planes being substantially parallel to one another, the predetermined distance being at least large enough to prevent the third processor from being in contact with the fourth processor; and connecting the second stacking device to the first stacking device.

18. The method of claim 17, wherein the stacking devices are high-speed, impedance-controlled connectors comprising conductive elements, the conductive elements electrically coupling the first, second, third and fourth buses together.

19. A method for stacking processors, the method comprising the steps of:

mounting a first processor on a first side of a first printed circuit board, the first printed circuit board having a first local bus, the first local bus being comprised of conductive traces, the first processor being electrically coupled to the first local bus;

mounting a second processor on a second side of the first printed circuit board, the second processor being electrically coupled to the first local bus;

mounting a third processor on a first side of a second printed circuit board, the second printed circuit board having a second local bus, the second local bus being comprised of conductive traces, the third processor being electrically coupled to the second local bus;

mounting a fourth processor on a second side of the second printed circuit board, the fourth processor being electrically coupled to the second local bus; and stacking the first and second printed circuit boards a predetermined distance apart from one another, the first and second printed circuit boards being stacked on a first stacking device, the first stacking device maintaining the first and second printed circuit boards substantially in first and second planes, respectively, the first and second planes being substantially parallel to each other, the predetermined distance being at least large enough to prevent the second processor from being in contact with the third processor.

20. The method of claim 19, wherein the stacking device is a high-speed, impedance-controlled connector comprising a group of conductive elements, the group pf conductive elements electrically coupling the first, second, third and fourth buses together.

* * * * *